(12) United States Patent
Tran

(10) Patent No.: US 6,411,555 B1
(45) Date of Patent: Jun. 25, 2002

(54) REFERENCE CHARGE GENERATOR, A METHOD FOR PROVIDING A REFERENCE CHARGE FROM A REFERENCE CHARGE GENERATOR, A METHOD OF OPERATING A REFERENCE CHARGE GENERATOR AND A DRAM MEMORY CIRCUIT FORMED USING MEMORY CELLS HAVING AN AREA OF 6F2

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/812,729

(22) Filed: Mar. 19, 2001

(51) Int. Cl.⁷ ................................................ G11C 7/00
(52) U.S. Cl. ................................ 365/189.09; 365/149
(58) Field of Search ........................ 365/189.09, 145, 365/149

(56) References Cited

U.S. PATENT DOCUMENTS

| | | | |
|---|---|---|---|
| 5,541,872 A | * 7/1996 | Lowrey et al. | 365/149 |
| 5,638,318 A | 6/1997 | Seyyedy | 365/145 |
| 5,677,865 A | 10/1997 | Seyyedy | 365/145 |
| 5,680,344 A | 10/1997 | Seyyedy | 365/145 |
| 5,700,733 A | 12/1997 | Manning | 438/439 |
| 5,828,615 A | 10/1998 | Mukunoki et al. | 365/210 |
| 5,880,989 A | 3/1999 | Wilson et al. | 365/145 |
| 6,141,204 A | 10/2000 | Schuegraf et al. | 361/313 |
| 6,150,211 A | 11/2000 | Zahurak | 438/244 |
| 6,153,899 A | 11/2000 | Ping | 257/296 |
| 6,165,833 A | 12/2000 | Parekh et al. | 438/240 |
| 6,175,146 B1 | 1/2001 | Lane et al. | 257/635 |
| 2001/0012213 A1 | * 9/2001 | Braun et al. | 365/145 |

* cited by examiner

Primary Examiner—Vu A. Le
(74) Attorney, Agent, or Firm—Wells St. John P. S.

(57) ABSTRACT

The present invention provides a method for providing a reference charge from a reference charge generator. The method includes coupling a pair of non-planar reference capacitors each having a capacitance $C_{REF}$ between a power supply voltage V and ground to provide a first stored charge $Q_{REF}$, where $Q_{REF}=C_{REF}V/2$, decoupling the pair of reference capacitors from the power supply voltage V and coupling the first stored charge $Q_{REF}$ from the pair of reference capacitors to a bitline.

64 Claims, 4 Drawing Sheets

REFERENCE CHARGE GENERATOR, A METHOD FOR PROVIDING A REFERENCE CHARGE FROM A REFERENCE CHARGE GENERATOR, A METHOD OF OPERATING A REFERENCE CHARGE GENERATOR AND A DRAM MEMORY CIRCUIT FORMED USING MEMORY CELLS HAVING AN AREA OF 6F2

TECHNICAL FIELD

This invention relates generally to a reference charge generator, a method for providing a reference charge from a reference charge generator, a method of operating a reference charge generator and a DRAM memory.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the non-active (or field) area of the substrate. These regions are typically termed as "field oxide" and are formed by LOCal Oxidation of exposed Silicon, commonly known as LOCOS. One approach in forming such oxide is to cover the active regions with layer of silicon nitride that prevents oxidation from occurring therebeneath. A thin intervening layer of a sacrificial pad oxide is provided intermediate the silicon substrate and nitride layer to alleviate stress and to protect the substrate from damage during subsequent removal of the nitride layer. The unmasked or exposed field regions of the substrate are then subjected to a wet ($H_2O$) oxidation, typically at atmospheric pressure and at temperatures of around 1000° C., for two to four hours. This results in field oxide growth where there is no masking nitride.

However, LOCOS structures do not necessarily lend themselves to progressively smaller feature sizes and/or increased densities. This is discussed to some extent in U.S. Pat. No. 5,700,733, filed on Jun. 27, 1995, entitled "Semiconductor Processing Methods Of Forming Field Oxide Regions On A Semiconductor Substrate" and issued to M. Manning, the disclosure of which is incorporated herein by reference for its teachings and which is assigned to the assignee of this patent document.

The above-noted patent presents a technique for using shallow trench isolation (STI) to realize a compact and robust DRAM cell having an area of $8F^2$. However, increasing demand for yet more compact and robust memory designs has continued to drive demand for even smaller cell areas.

Another alternative isolation technique uses an isolation gate structure formed between adjacent memory cells. The gate structure is biased to greatly reduce the number of mobile charge carriers in the semiconducting material beneath the isolation gate structure. This architecture has the advantage of providing extremely compact memory cells having an effective area of about $6F^2$ (compared, for example, to an area of about $8F^2$ for the LOCOS structures described above), resulting in a compact memory device.

As operating voltages are reduced to try to reduce overall system power requirements, bitline precharge circuitry may have to operate at voltages comparable to power supply voltages, i.e., at $V_{CC}$ or at ground. This arises because transistor threshold (i.e., turn-on) voltages tend to be order-of-magnitude comparable to the voltages now being used for power supply voltages. In turn, this necessitates techniques for generating reference charge magnitudes comparable to half of the amount of charge normally employed to store data in DRAM memory cells.

SUMMARY

In a first aspect, the present invention provides a reference charge generator for a memory. The reference charge generator includes a first switch having a control terminal and first and second load electrodes. The first load electrode is coupled to a bitline and the second load electrode is coupled to a first node. The reference charge generator also includes a first reference capacitor having a capacitance $C_{REF}$. The first reference capacitor has a non-planar capacitor configuration and has first and second terminals. The first terminal is coupled to the first node and the second terminal is coupled to a common node. The reference charge generator further includes a second reference capacitor having a capacitance $C_{REF}$. The second reference capacitor has a non-planar capacitor configuration and has first and second terminals. The second terminal is coupled to the commom node. The reference charge generator is configured to (i) couple at least one of the first and second reference capacitors to a voltage V, (ii) the at least one of the first and second capacitors from the voltage V, (iii) store a first charge $Q_1$ in at least one of the first and second reference capacitors and (iv) couple a reference charge $Q_{REF}$ from at least one of the first and second reference capacitors to the bitline, where $Q_{REF}=C_{REF}V/2$.

In another aspect, the present invention includes a reference charge generator for providing reference signals in a memory. The reference charge generator includes a first reference capacitor having capacitance $C_{REF}$. The first reference capacitor has a non-planar capacitor configuration and has first and second terminals. The second terminal is coupled to a common node. The reference charge generator also includes a second reference capacitor having capacitance $C_{REF}$. The second reference capacitor has a non-planar capacitor configuration and has first and second terminals. The second terminal is coupled to the common node. The reference charge generator further includes a first switch having a control electrode and first and second load electrodes. The first load electrode is coupled to a bitline, and the second load electrode is coupled to a first node and to the first terminal of the first reference capacitor. The reference charge generator additionally includes a second switch having a control electrode and first and second load electrodes. The first load electrode of the second switch is coupled to the first node. The second load electrode of the second switch is coupled to a second node and to the first terminal of the second capacitor. The reference charge generator also includes a third switch having a control electrode and first and second load electrodes. The first load electrode of the third switch is coupled to the second node and the second load electrode is coupled to a power supply conductor.

In a further aspect, the present invention includes a method for providing a reference charge from a reference charge generator. The method includes coupling a pair of non-planar reference capacitors each having a capacitance $C_{REF}$ between a power supply voltage V and ground to provide a first stored charge $Q_{REF}$, where $Q_{REF}=C_{REF}V/2$, decoupling the pair of reference capacitors from the power supply voltage V and coupling the first stored charge $Q_{REF}$= from the pair of reference capacitors to a bitline.

DETAILED DESCRIPTION

This disclosure of embodiments in accordance with the present invention is submitted in furtherance of the constitutional purposes of the U.S. Patent Laws "to promote the progress of science and useful arts" (Article 1, Section 8).

Figure 1:
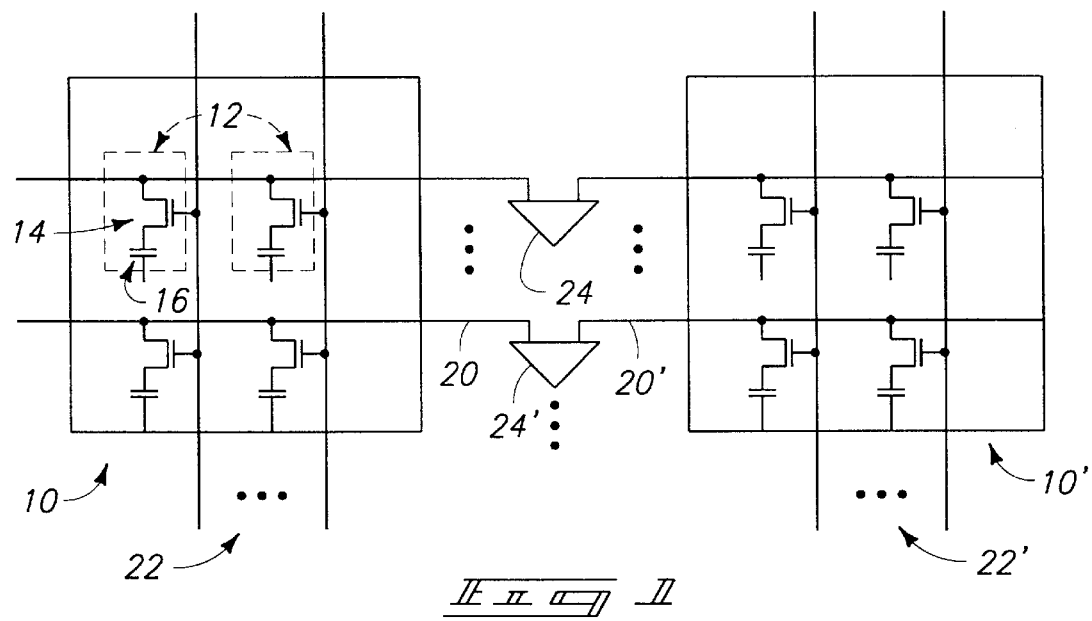
FIG. 1 is a simplified schematic diagram describing an exemplary pair of memory arrays in an open bitline configuration and using memory cells formed from one transistor and one capacitor, in accordance with the prior art.

FIG. 1 is a simplified schematic diagram describing a pair of memory arrays 10, 10' in an open bitline configuration, each using memory cells 12 formed from one transistor 14 and one capacitor 16, in accordance with the prior art. The memory arrays 10, 10' are each coupled to respective groups of bitlines 20, 20' and respective groups of wordlines 22, 22'. The two groups of bitlines 20, 20' are coupled, one from each of the memory arrays 10, 10', to sense amplifiers 24, 24'.

In operation, one memory cell 12 is selected when one wordline 22 or 22' and one bitline 20 or 20' are activated. The wordline 22 or 22' is coupled to a gate electrode of one of the transistors 14 and the bitline 20 or 20' is coupled to a load electrode of that transistor 14. That transistor 14 is then turned ON, coupling charge stored in the capacitor 16 to the associated bitline 20 or 20'. The other of these bitlines 20 or 20' is provided with a reference signal, as will be described later.

The sense amplifier 24 or 24' then senses the charge coupled from the capacitor 16 to the bitline 20 or 20', compares that signal to the reference signal coupled to the corresponding bitline 20' or 20, amplifies the resulting signal and latches the amplified signal for an appropriate duration. This allows data represented by the charge stored in the capacitor 16 to be accessed external to the memory arrays 10, 10' and also allows the capacitor 16 to store charge representative of the data from the memory cell 12 back into that memory cell 12.

Many types of memories use sense amplifiers 24, 24' that pre-charge the bitlines 20 to a reference signal that has a predetermined voltage level, usually about one-half of a power supply voltage $V_{CC}$. However, as smaller power supply voltages $V_{CC}$ are employed to reduce overall power consumption, this is not possible. One reason for this is that the transistors used in the sense amplifiers 24, 24' have threshold voltages that are too large to permit effective operation of the sense amplifiers 24, 24' when the bitlines 20 are precharged with reference signals corresponding to voltages comparable to the threshold voltages.

As a result, in some of these types of memories, a reference charge $Q_{REF}$ is generated for comparison purposes as described above. Choosing a magnitude of the reference charge $Q_{REF}$ to be about one-half of the maximum charge stored in one of the capacitors 16 allows optimal dynamic range and maximizes charge storage times consistent with the power supply voltage $V_{CC}$.

Sense amplifiers similar to the sense amplifiers 24, 24' of FIG. 1 are described, for example, in U.S. Pat. No. 5,680,344, entitled "Circuit And Method Of Operating A Ferroelectric Memory In A DRAM Mode", in U.S. Pat. No. 5,638,318, entitled "Ferroelectric Memory Using Ferroelectric Reference Cells", and in U.S. Pat. No. 5,677,865, entitled "Ferroelectric Memory Using Reference Charge Circuit", all issued to M. Seyyedy and assigned to the assignee of this invention, which patents are hereby incorporated herein for their teachings.

The maximum charge $Q_M$ that a capacitor having a capacitance C can store in such a system is $Q_M = CV_{CC}$. In memories that employed planar capacitors (e.g., MOS capacitors), a reference cell providing a reference capacitance $C_{REF}$ using a capacitor of half the size (i.e., having one-half of the area) of the data storage capacitors 16 provided an easy way to generate a reference charge $Q_{REF}$ one-half as large as the maximum charge normally stored in the data storage capacitors 16.

However, as DRAM circuit densities increased, and the data storage capacities of memory arrays 10, 10' increased, new types of non-planar capacitors were required and were developed. Container capacitors, examples of which are known as crown or container capacitors, were developed. These types of capacitors do not lend themselves readily to simultaneous formation of capacitors having a wide range of different capacitance values.

Figure 2:
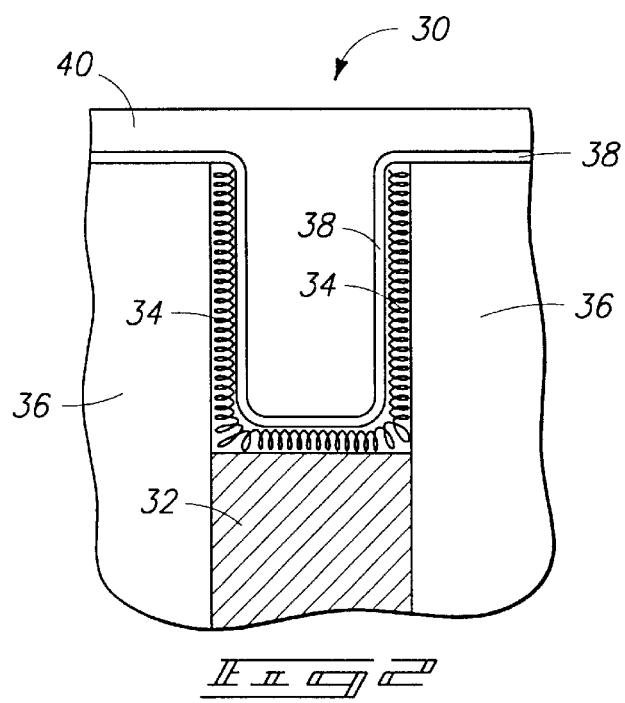
FIG. 2 is a simplified cross-sectional view of an exemplary container capacitor useful with the circuits of FIG. 1, in accordance with the prior art.

FIG. 2 is a simplified cross-sectional view of an exemplary container capacitor 30 useful with the circuit of FIG. 1, in accordance with the prior art. Container capacitors 30 are described, for example, in U.S. Pat. No. 6,175,146 B1, entitled "Semiconductor Processing Methods Of Forming Integrated Circuit Memory Devices, Methods Of Forming Capacitor Containers, Methods Of Making Electrical Connection To Circuit Nodes And Related Integrated Circuitry", issued to Lane et al.; U.S. Pat. No. 6,150,211, entitled "Methods Of Forming Storage Capacitors In Integrated Circuitry Memory Cells And Integrated Circuits", issued to Zahurak; and U.S. Pat. No. 6,153,899, entitled "Capacitor Array Structure For Semiconductor Devices", issued to Ping, which patents are assigned to the assignee of the present application and which are also hereby incorporated herein for their teachings.

The container capacitor 30 is formed atop a conductive interconnection 32. In one embodiment, the interconnection 32 is formed from conductive polysilicon. In one embodiment, the interconnection 32 extends down to a node formed on the substrate. In one embodiment, the interconnection 32 extends to a load electrode of one of the transistors 14 (not shown in FIG. 2) that acts as an access transistor formed on the substrate.

The container capacitor 30 includes a first capacitor electrode 34 formed within a "container" that has been etched into an insulative material 36. The first capacitor electrode 34 may be formed from roughened polysilicon or hemispherical grain polysilicon to increase an area of the first capacitor electrode 34. A dielectric layer 38 is then formed, and a polysilicon cell plate 40 is formed atop the dielectric layer 38. The resultant container capacitor 30 is approximately cylindrical, with the capacitance of the container capacitor being a strong function of the height of the container capacitor. As a result, it is difficult or impractical to attempt to form multiple container capacitors in a common set of processing steps unless they all have substantially similar capacitance values.

The container capacitors 30 shown in FIG. 2 are fabricated after the transistors 14 are formed on a semiconductive substrate (such as monocrystalline silicon, not shown in FIG. 2).

In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 3:
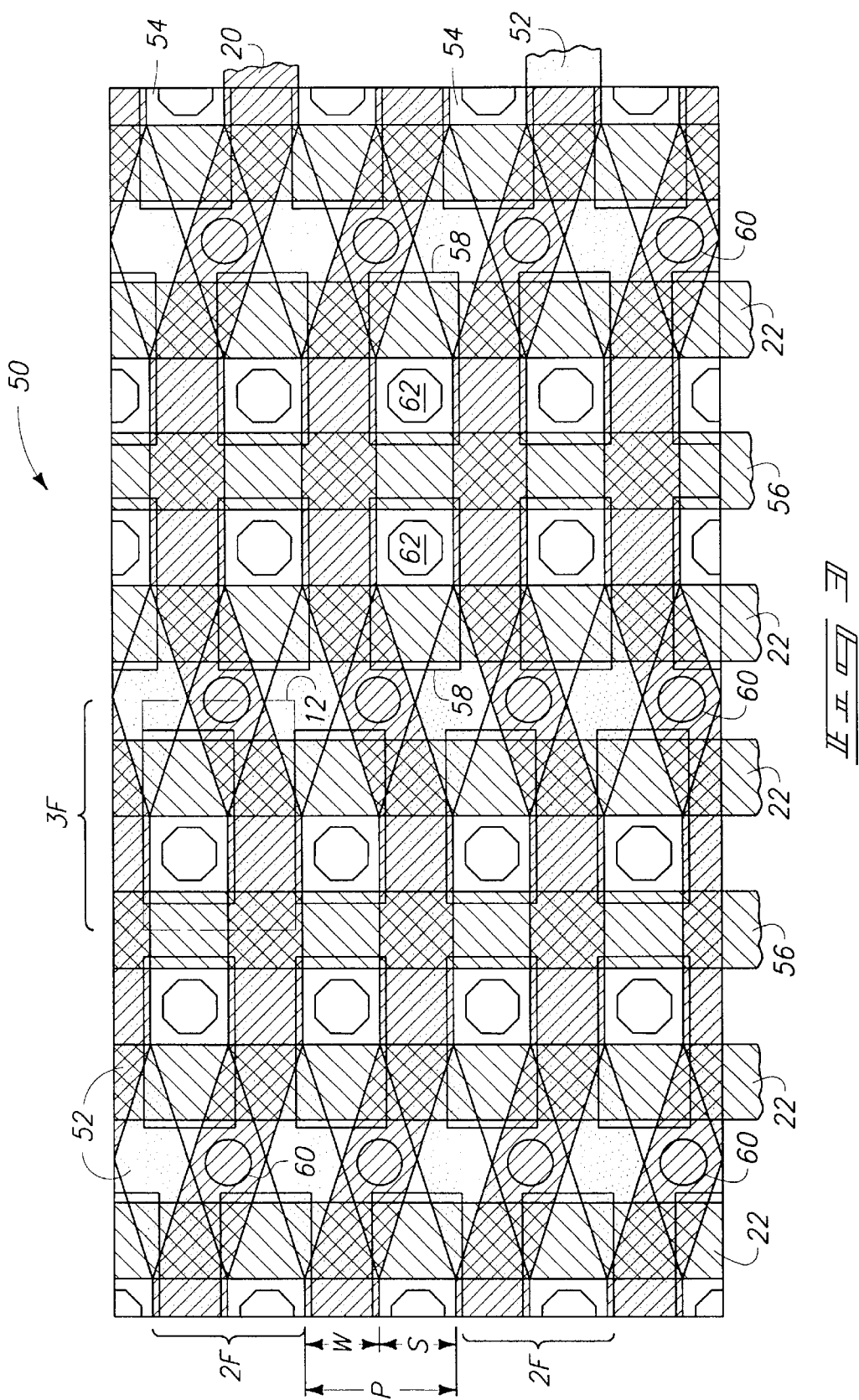
FIG. 3 is a simplified plan view of a circuit layout for a $6F^2$ memory array, in accordance with an embodiment of the present invention.

FIG. 3 is a simplified plan view of a circuit layout for a $6F^2$ memory array 50, in accordance with an embodiment of the present invention. The memory array 50 corresponds to the memory arrays 10, 10' of FIG. 1.

Shallow trench isolation (STI) areas 52 are represented as stippled areas following a serpentine path across the memory array 50, with active areas 54 intervening between adjacent STI areas 52. Active areas 54 are shown as areas that are void of the stippling denoting the STI areas 52.

Bitlines 20, shown as hatched areas, also follow a serpentine path across the memory array 50, but are typically formed much later in processing than the STI areas 52. Wordlines 22 (FIG. 1), also shown as hatched areas, extend along an axis intersecting the STI areas 52 and the bitlines 20, and extend across portions of the active areas 54 where the wordlines 22 form gates of access transistors 14 (FIG. 1).

The memory array 50 also includes isolation gates 56 interspersed between selected ones of the wordlines 22. The memory array 50 further includes capacitor containers 58, represented as rectangles, and bitline contacts 60, represented as circles. Container capacitors 30 (FIG. 2) formed within the capacitor containers 58 are coupled to the active areas via storage node contacts 62, comprising conductive material (e.g., 32, FIG. 2) extending to selected portions of the active area 54 and represented by octagons at one end of each of the capacitor containers 58. While the access transistors 14 from FIG. 1 are not explicitly shown in FIG. 3 for clarity of illustration, each access transistor 14 includes, e.g., a bitline contact 60, an adjacent wordline 22 and an adjacent storage node contact 62.

A cell plate (not shown in FIG. 3) formed of a conductive material such as doped polysilicon extends across tops of the capacitor containers 58 and forms a common signal ground for capacitors formed within the capacitor containers 58. The isolation gates 56 are formed to isolate adjacent ones of the storage node contacts 62.

Each memory cell 12 within the memory array 50 includes part of one of the bitline contacts 60, which are shared by adjacent memory cells 12, a storage node contact 62, a portion of one of the active area 54, a portion of one isolation gate 56 and a portion of one STI area 52 and is bounded by a corresponding portion of another STI area 52. Isolation between two adjacent storage node contacts 62 formed in a common portion of an active area 54 that includes one of the bitline contacts 60 results because only one of the pair of wordlines 22 traversing the common portion of active area 54 is turned ON at any one time.

As a result, the architecture shown in FIG. 3 provides compact memory cells 12 having areas less than that of memory cells formed, for example, in the previously-discussed LOCOS memory structure. This area is equal to about 3F×2F, or less, where "F" is defined as equal to one-half of minimum pitch, with minimum pitch (i.e., "P") being defined as equal to the smallest distance of a line width (i.e., "W") plus width of a space immediately adjacent that line on one side of that line between that line and a next adjacent line in a repeated pattern within the array 50 (i.e., "S"). Thus, in the preferred implementation, the consumed area of a given memory cell 12 is no greater than about $6F^2$.

Figure 4:
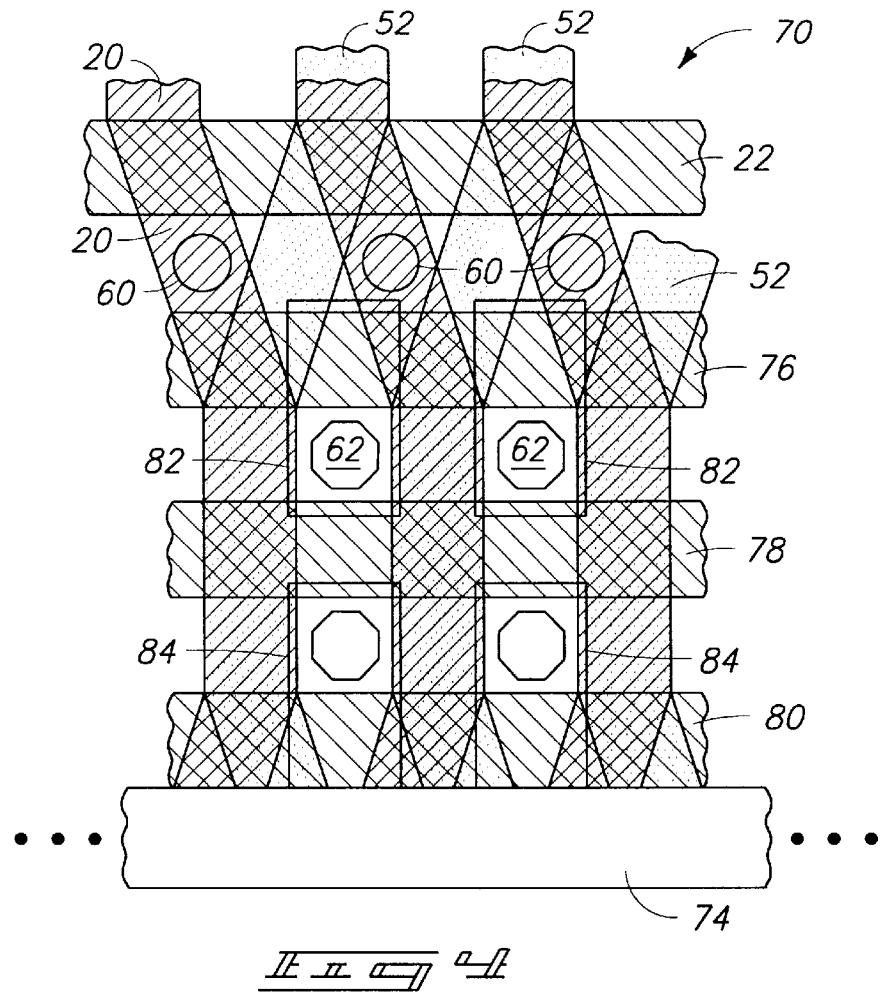
FIG. 4 is a simplified plan view of an edge portion of a circuit layout for the $6F^2$ memory array of FIG. 3, in accordance with embodiments of the present invention.

FIG. 4 is a simplified plan view of an edge portion 70 of a circuit layout for the $6F^2$ memory array 50 of FIG. 3, in accordance with an embodiment of the present invention. The edge portion 70 includes portions of the active areas 54 of FIG. 3, shown rotated ninety degrees with respect to the view of FIG. 3, coupled to a common active area portion 74 that is represented as a horizontal stripe. In one embodiment, the common active area portion 74 is grounded. In one embodiment, the common active area portion 74 is at a potential other than ground. In one embodiment, the common active area portion 74 is at or near $V_{CC}$. In at least this embodiment, the combined capacitance of capacitors 82 and 84 may be as much as twice the capacitance of the data storage capacitors 16 of FIG. 1.

The edge portion 70 includes a first control electrode 76, a second control electrode 78, a third control electrode 80 and a wordline 22. The edge portion 70 also includes container capacitors 82 and 84 each having storage node contacts 62. In conventional DRAMs, the container capacitors 84 typically form dummy or inoperative memory cells 12. In one embodiment, the container capacitors 84 may be formed to be slightly larger than container capacitors 58 employed for data storage within the memory array 50 of FIG. 3. In one embodiment, the container capacitors 84 may be formed to be about the same size as container capacitors 58 employed for data storage within the memory array 50 of FIG. 3.

Figure 5:
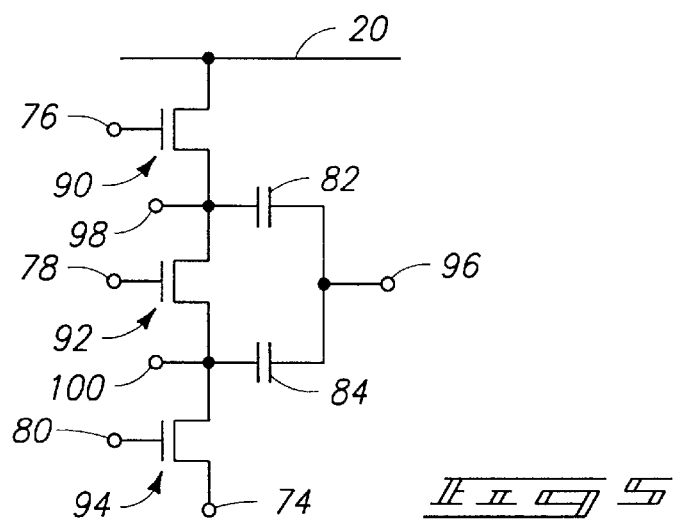
FIG. 5 is a simplified schematic diagram corresponding to the edge portion of FIG. 4, in accordance with embodiments of the present invention.

FIG. 5 is a simplified schematic diagram corresponding to the edge portion 70 of FIG. 4, in accordance with an embodiment of the present invention. The schematic diagram of FIG. 5 includes a first switch 90 having a control electrode corresponding to the first control electrode 76 of FIG. 4, a second switch 92 having a control electrode corresponding to the second control electrode 78 of FIG. 4 and a third switch 94 having a control electrode corresponding to the third control electrode 80 of FIG. 4.

Figure 6:
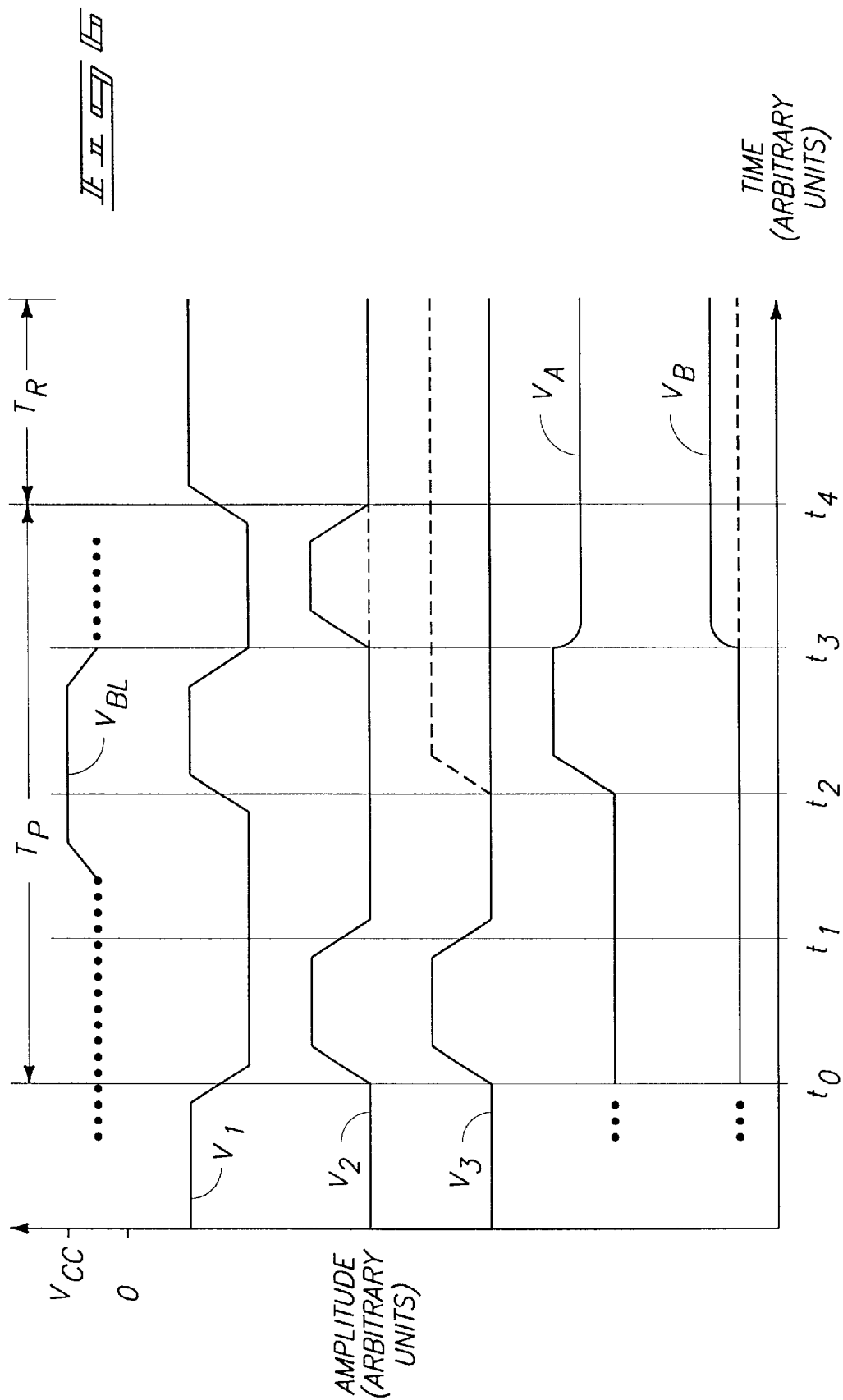
FIG. 6 depicts a series of waveforms applicable to the schematic diagram of FIG. 5, in accordance with embodiments of the present invention.

In one embodiment, the switches 90, 92 and 94 comprise PMOS transistors, with appropriate modification of drive signals from the examples of FIG. 6. In one embodiment, the switches 90, 92 and 94 comprise NMOS transistors.

The capacitors 82 and 84 include one electrode coupled to a common node 96. Capacitor 82 includes a second electrode coupled to a node 98 and capacitor 84 includes a second electrode coupled to a node 100.

The first switch 90 has one load electrode coupled to a bitline 20 (corresponding to one of the bitline contacts 60 of FIG. 4) and another load electrode coupled to the node 98. The second switch 92 has one load electrode coupled to the node 98 and another load electrode coupled to the node 100. The third switch 94 has one load electrode coupled to the node 100 and another load electrode coupled to a stable potential such as ground. In one embodiment, the switches 90, 92 and 94 comprise NMOS transistors, the control electrodes correspond to gates and the load electrodes correspond to source/drain electrodes.

It will be appreciated that reference charges $Q_{REF}$ having a magnitude other than about one-half of the maximum charge stored in one of the capacitors 16 may be desirable. Methods for generation of reference charge magnitudes $Q_{REF}$ having values in an analog range from zero to about twice of the maximum charge stored in one of the capacitors 16 include varying the voltage supplied to the node 74. For example, choosing a reference voltage in the range of zero to $V_{CC}$ allows the amount of reference charge $Q_{REF}$ that is stored to be varied in an analog fashion.

These methods also include techniques for coupling both of the capacitors 82 and 84 in parallel to both the potentials used to charge the capacitors 82 and 84 and to a load such as the bitline 20 or 20'. For example, these capacitors 82 and 84 might be used to form a redundant row of memory cells 12 at the array periphery. These memory cells might also need to be more robust than memory cells within the periphery. Coupling the capacitors 82 and 84 in parallel can provide an added degree of charge storage robustness.

FIG. 6 depicts a series of voltage waveforms $V_{BL}$, $V_1$, $V_2$, $V_3$, $V_A$ and $V_B$ versus time applicable to the schematic diagram of FIG. 5, in accordance with an embodiment of the present invention. In this embodiment, the node 96 of FIG. 5 is coupled to the cell plate mentioned with respect to FIG. 3 and thus is coupled to a common node or signal ground.

The voltage $V_{BL}$ corresponds to the bitline 20. The voltages $V_1$, $V_2$ and $V_3$ correspond to the control electrodes 76, 78 and 80, respectively. The voltages $V_A$ and $V_B$ correspond to the nodes 98 and 100, respectively.

The time scale of FIG. 6 includes a portion $T_P$, corresponding to precharging, and a portion $T_R$, corresponding to reading stored data from the memory array 50 of FIG. 3. The voltage $V_{BL}$ behaves similarly to conventional precharging bitline voltages for systems employing reference capacitors and so is described only in terms of aspects relevant to the present embodiment.

The precharging portion $T_P$ includes times denoted $t_0$–$t_4$. At time $t_0$, a precharging cycle has been initiated. Voltage $V_1$, applied to first control electrode 76, goes LOW, turning the first switch OFF. Voltages $V_2$ and $V_3$ then go HIGH, turning the second 92 and third 94 switches ON. Voltages $V_A$ and $V_B$ are undefined until just after $t_0$ and after switches 92 and 94 have been turned ON, at which time voltages $V_A$ and $V_B$ are LOW.

At time $t_1$, voltages $V_2$ and $V_3$ go LOW, turning switches 92 and 94 OFF. This decouples nodes 98 and 100 from ground or other voltage sources.

At time $t_2$, voltage $V_1$ goes HIGH, turning switch 90 ON. The voltage $V_{BL}$ on the bitline 20 of FIG. 5 is undefined until before time $t_2$, at which time the voltage $V_{BL}$ is charged to a power supply voltage such as $V_{CC}$. The switch 90 couples the voltage $V_{BL}$ from the bitline contact 60 of FIG. 4 to the node 98, causing the capacitor 82 to charge. The capacitor 82, in this embodiment, comprises a capacitance $C_{REF}$ and thus holds a charge $Q=C_{REF}V_{CC}$ during the interval from $t_2$ to $t_3$, and the voltage $V_A$ on node 98 corresponds to the power supply voltage.

At time $t_3$, voltage $V_1$ goes LOW, turning switch 90 OFF. The node 98 is then only coupled to one terminal of the capacitor 82. Voltage $V_2$ then goes HIGH, turning the switch 92 ON, coupling the node 98 to the node 100 and thus coupling the capacitors 82 and 84 in parallel. As a result, the stored charge Q is split between the capacitors 82 and 84. When the capacitors 82 and 84 have the same capacitance, the stored charge Q is split evenly such that each capacitor 82 and 84 has an individual charge $Q_{REF}$ of $C_{REF}V_{CC}/2$, and the nodes 98 and 100 have a voltage of $V_{CC}/2$ thereon.

At some time between $t_3$ and $t_4$, the bitline contact 60 is decoupled from the power supply potential, is then precharged. In one embodiment, the bitline contact 60 is precharged to a voltage at or close to $V_{CC}$, and subsequently is decoupled from all fixed voltage sources, ready for the next read cycle. At time $t_4$, the voltage $V_2$ goes LOW, turning the switch 92 OFF. Slightly thereafter, the voltage $V_1$ goes HIGH, turning the switch 90 ON and coupling the charge $Q_{REF}$ to the bitline contact 60 and thus, for example, to a selected bitline 20 in the memory array 50 of FIG. 3.

After time $t_4$, the precharging portion $T_P$ of the cycle is completed, and the read portion $T_R$ begins. At this time, the charge $Q_{REF}$ has been coupled to the bit line contact 60 and thus, for example, to a corresponding bitline 20 in the memory array 50 of FIG. 3, e.g., the memory array 10 of FIG. 1. A selected one of the memory cells 12 in the counterpart memory array 10' is coupled to a corresponding bitline 20', with voltages developed on the two bitlines 20, 20' being compared by that sense amplifier 24 or 24' to which both of these bitlines 20, 20' are coupled.

In another embodiment, the circuit of FIG. 5 is realized such that the node 96 floats and is not coupled to a cell plate. The waveforms corresponding to voltages $V_1$, $V_2$ and $V_3$ may operate as shown for times $t_0$–$t_2$. During the time $t_2$ and continuing through the read cycle portion $T_R$, the voltage $V_3$ goes HIGH (dashed portion in FIG. 6), turning the third switch 94 ON and coupling the node 100 to ground. From the time $t_2$ through the read portion, the voltage $V_2$ stays LOW (dashed portion during $t_3$–$t_4$ interval), and, thus, the second switch 92 stays OFF. As a result, the voltage $V_B$ stays LOW from time $t_2$ through the read portion $T_R$, and the capacitors 82 and 84 are coupled in series.

During the interval $t_2$–$t_3$, the voltage $V_1$ goes HIGH, and the first switch 90 is turned ON, at which time the bitline 20 is coupled to a power supply voltage such as $V_{CC}$ and the voltage $V_{BL}$ charges the series combination of capacitors 82 and 84 to the voltage $V_{BL}$, presented at the bitline 20. The series combination of capacitors 82 and 84 presents a net capacitance of $C_{REF}/2$, with the result that the total stored charge $Q_{REF}$ is $C_{REF}V_{CC}/2$.

During the interval $t_3$–$t_4$, the bitline contact 60 is first precharged to a predetermined level, at or close to $V_{CC}$ or $V_{SS}$, and subsequently is decoupled from all fixed voltage sources. Slightly thereafter, the voltage $V_1$ goes HIGH, turning the first switch 90 ON and coupling the charge $Q_{REF}$ to the bitline contact 60 and thus to a selected bitline 20 in the memory array 50 of FIG. 3.

Each of these embodiments thus realizes a reference charge $Q_{REF}$ that is about one-half of the maximum stored charge presented in memory cells 12 in the memory arrays 50 (FIG. 3) or 10, 10' (FIG. 1). Choosing this reference charge $Q_{REF}$ level permits optimal dynamic range and maximizes charge storage times consistent with the power supply voltage $V_{CC}$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A reference charge generator comprising:
   a first switch having a control terminal and first and second load electrodes, the first load electrode being coupled to a bitline, the second load electrode being coupled to a first node;
   a first reference capacitor having a capacitance $C_{REF}$ and having first and second terminals, the first terminal being coupled to the first node, the second terminal being coupled to a common node;
   a second reference capacitor having a capacitance $C_{REF}$ and having first and second terminals, the second terminal being coupled to the common node;
   wherein the reference charge generator is configured to:
   couple at least one of the first and second reference capacitors to a voltage V;
   decouple the at least one of the first and second capacitors from the voltage V;
   store a first charge $Q_1$ in at least one of the first and second reference capacitors; and
   couple a reference charge $Q_{REF}$ from at least one of the first and second reference capacitors to the bitline, where $Q_{REF}=C_{REF}V/2$.

2. The reference charge generator of claim 1, wherein the common node comprises a cell plate.

3. The reference charge generator of claim 1, wherein the voltage V is chosen to be in a range between zero volts and a power supply voltage $V_{CC}$, inclusive.

4. The reference charge generator of claim 1, wherein the first and second reference capacitors comprise non-planar container capacitors.

5. The reference charge generator of claim 1, wherein the first and second reference capacitors comprise non-planar container capacitors and are formed along an edge of a DRAM memory array.

6. The reference charge generator of claim 1, wherein the first and second reference capacitors comprise container capacitors and are formed along an edge of a DRAM memory array, the DRAM memory array including storage capacitors each having capacitance less than or equal to $C_{REF}$.

7. The reference charge generator of claim 1, wherein the first switch comprises an NMOS transistor.

8. The reference charge generator of claim 1, further comprising:
   a second switch having a control electrode and first and second load electrodes, the first load electrode of the second switch being coupled to the first node, the second electrode of the second switch being coupled to a second node and to the first terminal of the second reference capacitor; and
   a third switch having a control electrode and first and second load electrodes, the first load electrode of the third switch being coupled to the second node and the second load electrode being coupled to a power supply conductor, wherein the reference charge generator configured to couple at least one of the first and second reference capacitors to a voltage V is configured to couple the first storage capacitor to the voltage V to store the charge $Q_1$ in the first reference capacitor and wherein the first charge $Q_1$ is $Q_1=VC_{REF}$; and
   wherein the reference charge generator is further configured to:
   accept a first portion of a first control signal at the control electrode of the first switch, the first portion of the first control signal causing the first switch to decouple the first node from the bitline;
   accept a first portion of a second control signal at the control electrode of the second switch, the first portion of the second control signal being configured to cause the second switch to couple the first node to the second node and to cause the first charge $Q_1$ to be split between the first and second reference capacitors leaving a charge $Q_{REF}$ in the first reference capacitor, where $Q_{REF}=V\ C_{REF}/2$; and then to decouple the first and second nodes from each other;
   accept a first portion of a third control signal at the control electrode of the third switch, the first portion of the third control signal being configured to cause the third switch to couple the second node to ground after the second switch decouples the first and second nodes from each other; and
   accept a second portion of the first control signal, the second portion of the first control signal being configured to couple the first node to the bitline and to couple at least a portion of the charge $Q_{REF}$ from the first reference capacitor to the bitline.

9. The reference charge generator of claim 8, wherein the first, second and third switches comprise NMOS transistors.

10. The reference charge generator of claim 8, wherein the first, second and third switches comprise PMOS transistors.

11. The reference charge generator of claim 8, wherein the common node comprises a cell plate.

12. The reference charge generator of claim 1, wherein the reference charge generator configured to couple at least one of the first and second reference capacitors to a voltage V comprises a reference charge generator configured to couple a series combination of the first and second reference capacitors to the voltage V, wherein the reference charge generator configured to store a first charge $Q_1$ in at least one of the first and second reference capacitors comprises a reference charge generator configured to store a first charge $Q_1=C_{REF}V/2$ in the series combination, and where the reference charge generator configured to couple a reference charge $Q_{REF}$ from at least one of the first and second reference capacitors comprises a reference charge generator configured to couple the series combination to the bitline and to couple at least a portion of the charge $Q_{REF}$ from the series combination to the bitline.

13. The reference charge generator of claim 11, wherein the common node comprises a floating node.

14. A reference charge generator for providing reference signals in a memory, comprising:
   a first reference capacitor having capacitance $C_{REF}$ and having first and second terminals, the second terminal being coupled to a common node;
   a second reference capacitor having capacitance $C_{REF}$ and having first and second terminals, the second terminal being coupled to the common node;
   a first switch having a control electrode and first and second load electrodes, the first load electrode being coupled to a bitline, the second load electrode being coupled to a first node and to the first terminal of the first reference capacitor;
   a second switch having a control electrode and first and second load electrodes, the first load electrode of the second switch being coupled to the first node, the second load electrode of the second switch being coupled to a second node and to the first terminal of the second capacitor; and a third switch having a control electrode and first and second load electrodes, the first load electrode of the third switch being coupled to the second node and the second load electrode being coupled to a power supply conductor.

15. The reference charge generator of claim 14, wherein the common node comprises a cell plate.

16. The reference charge generator of claim 14, wherein the first and second reference capacitors comprise container capacitors.

17. The reference charge generator of claim 14, wherein the first and second reference capacitors comprise container capacitors and are formed along an edge of a DRAM memory array.

18. The reference charge generator of claim 14, wherein the first and second reference capacitors comprise container capacitors and are formed along an edge of a DRAM memory array, the DRAM memory array including storage capacitors each having capacitance less than or equal to $C_{REF}$.

19. The reference charge generator of claim 14, wherein the first, second and third switches and the first and second reference capacitors are configured to:
   accept a first portion of a first control signal at the control electrode of the first switch, the first portion of the first control signal causing the first switch to decouple the first node from the bitline and thus to decouple the first reference capacitor from a voltage supply having a voltage V and to store a charge $Q_1$ in the first reference capacitor, where $Q_1=C_{REF}V$;
   accept a first portion of a second control signal at the control electrode of the second switch, the first portion of the second control signal being configured to cause the second switch to couple the first node to the second node and then to decouple the first and second nodes from each other, the first and second reference capacitors each storing a charge $Q_{REF}=C_{REF}V/2$ after decoupling;
   accept a first portion of a third control signal at the control electrode of the third switch, the first portion of the third control signal being configured to cause the third switch to couple the second node to ground after decoupling; and
   accept a second portion of the first control signal, the second portion of the first control signal being configured to couple the first node to the bitline and to provide the charge $Q_{REF}$ from the first reference capacitor to the bitline.

20. The reference charge generator of claim 14, wherein the voltage V is chosen to be in a range between zero volts and a power supply voltage $V_{CC}$, inclusive.

21. The reference charge generator of claim 14, wherein the first, second and third switches comprise NMOS transistors.

22. The reference charge generator of claim 14, wherein the first, second and third switches comprise PMOS transistors.

23. A method for providing a reference charge from a reference charge generator comprising:
   coupling at least one of a pair of non-planar reference capacitors each having a capacitance $C_{REF}$ between a power supply voltage V and ground to provide a first stored charge $Q_{REF}$, where $Q_{REF}=C_{REF}V/2$;
   decoupling the pair of reference capacitors from the power supply voltage V; and
   coupling the first stored charge $Q_{REF}$ from the pair of reference capacitors to a bitline.

24. The method of claim 23, wherein the voltage V is chosen to be in a range between zero volts and a power supply voltage $V_{CC}$, inclusive.

25. The method of claim 23, wherein coupling the pair of reference capacitors between a power supply and ground comprises coupling the pair of reference capacitors in series between the power supply voltage V and ground, and wherein coupling the first stored charge $Q_{REF}$ comprises coupling the pair of reference capacitors in series to the bitline.

26. The method of claim 23, wherein coupling the pair of reference capacitors between a power supply voltage V and ground comprises:
   coupling a first of the pair of reference capacitors in parallel between the power supply voltage V and ground to store a first charge $Q_1$ in the first reference capacitor of $Q_1=C_{REF}V$;
   decoupling the pair of reference capacitors from the power supply voltage V and coupling the pair of reference capacitors in parallel to split the first stored charge $Q_1$ between the pair of reference capacitors and store in each of the pair a second stored charge $Q_2$, where $Q_2=VC_{REF}/2$; and
   coupling the second stored charge $Q_2$ from only one of the reference capacitors to the bitline to provide a reference signal level on the bitline.

27. The method of claim 23, wherein each of the pair of reference capacitors comprises a container capacitor.

28. The method of claim 23, wherein each of the pair of reference capacitors comprises a container capacitor, the method further comprising:
   providing the first stored charge to a first input to a sense amplifier;
   coupling a stored charge representing data from a memory cell to another bitline; and
   comparing the first stored charge to the stored charge representing data in the sense amplifier.

29. The method of claim 23, further comprising setting charge stored in each of the pair of reference capacitors to zero prior to coupling the pair of non-planar reference capacitors between a power supply voltage V and ground.

30. The method of claim 23, wherein the first and second reference capacitors comprise container capacitors and are formed along an edge of a DRAM memory array.

31. The method of claim 23, wherein the first and second reference capacitors comprise container capacitors and are formed along an edge of a DRAM memory array, the DRAM memory array including storage capacitors each having capacitance less than or equal to $C_{REF}$.

32. A method of operating a reference charge generator for providing reference signals in a memory including a bitline, the reference charge generator including first, second and third switches each having a control electrode and first and second load electrodes, the reference charge generator including first and second non-planar reference capacitors each having a capacitance of about $C_{REF}$, the reference charge generator including a first node coupled to the first capacitor and a second node coupled to the second capacitor, the method comprising:
   accepting a first portion of a first control signal at the control electrode of the first switch, the first portion of the first control signal causing the first switch to decouple a first electrode of the first reference capacitor from the bitline and thus to decouple the first reference capacitor from a voltage supply having a voltage V and to store a charge $Q_1$ in the first reference capacitor, where $Q_1=C_{REF}V$;

accepting a first portion of a second control signal at the control electrode of the second switch, the first portion of the second control signal being configured to cause the second switch to couple the first node to the second node and then to decouple the first and second nodes from each other, the first and second reference capacitors each storing a charge $Q_{REF}=C_{REF}V/2$ after decoupling;

accepting a first portion of a third control signal at the control electrode of the third switch, the first portion of the third control signal being configured to cause the third switch to couple the second node to ground after decoupling; and accepting a second portion of the first control signal, the second portion of the first control signal being configured to couple the first node to the bitline and to provide the charge $Q_{REF}$ from the first reference capacitor to the bitline.

33. The method of claim 32, wherein the voltage V is chosen to be in a range between zero volts and a power supply voltage $V_{CC}$, inclusive.

34. The method of claim 32, wherein the first, second and third switches comprise NMOS transistors.

35. The method of claim 32, wherein the first and second reference capacitors comprise container capacitors and are formed along an edge of a DRAM memory array formed in a DRAM memory, the DRAM memory array including storage capacitors each having capacitance less than or equal to $C_{REF}$, the DRAM memory also including sense amplifiers each coupled to bitlines from the DRAM memory array and further comprising comparing the charge $Q_{REF}$ from the first reference capacitor to a stored charge from a memory cell in the memory array to read data from the memory array represented by the stored charge from the memory cell.

36. A DRAM integrated circuit formed using memory cells having an area of $6F^2$, where F is equal to one-half of a pitch of periodic elements forming the memory cells, the DRAM comprising:
   a first group of wordlines and an orthogonal first group of bitlines;
   a first array of memory cells, each of the memory cells of the first array being coupled to a unique combination of one of the first group of wordlines and one of the first group of bitlines;
   a second group of wordlines and an orthogonal second group of bitlines;
   a second array of memory cells, each of the memory cells of the second array being coupled to a unique combination of one of the second group of wordlines and one of the second group of bitlines;
   a series of sense amplifiers each having two inputs, one input of each sense amplifier being coupled to a bitline associated with the first array and another input of each sense amplifier being coupled to a corresponding bitline associated with the second array; and
   each array including a reference charge generator, each reference charge generator including:
   a first switch having a control terminal and first and second load electrodes, the first load electrode being coupled to a bitline, the second load electrode being coupled to a first node;
   a first reference capacitor having a capacitance $C_{REF}$ and comprising a non-planar capacitor configuration having first and second terminals, the first terminal being coupled to the first node, the second terminal being coupled to a common node;
   a second reference capacitor having a capacitance $C_{REF}$ and comprising a non-planar capacitor configuration having first and second terminals, the second terminal being coupled to the common node;
   wherein each reference charge generator is configured to:
      couple at least one of the first and second reference capacitors to a voltage V;
      decouple the at least one of the first and second capacitors from the voltage V;
      store a first charge $Q_1$ in at least one of the first and second reference capacitors; and
      couple a reference charge $Q_{REF}$ from at least one of the first and second reference capacitors to the bitline, where $Q_{REF}=C_{REF}V/2$.

37. The DRAM of claim 36, wherein the common node comprises a cell plate.

38. The DRAM of claim 36, wherein the first and second reference capacitors comprise container capacitors.

39. The DRAM of claim 36, wherein the voltage V is chosen to be in a range between zero volts and a power supply voltage $V_{CC}$, inclusive.

40. The DRAM of claim 36, wherein the first and second reference capacitors comprise container capacitors and are formed along an edge of a DRAM memory array.

41. The DRAM of claim 36, wherein the first and second reference capacitors comprise container capacitors and are formed along edges of the DRAM memory arrays, the DRAM memory arrays including storage capacitors each having capacitance less than or equal to $C_{REF}$.

42. The DRAM of claim 36, wherein the first switch comprises an NMOS transistor.

43. The DRAM of claim 36 wherein the first, second and third switches comprise PMOS transistors.

44. The DRAM of claim 36 wherein each reference charge generator further comprises:
   a second switch having a control electrode and first and second load electrodes, the first load electrode of the second switch being coupled to first node, the second electrode of the second switch being coupled to a second node and to the first terminal of the second reference capacitor; and
   a third switch having a control electrode and first and second load electrodes, the first load electrode of the third switch being coupled to the second node and the second load electrode being coupled to a power supply conductor, wherein the reference charge generator configured to couple at least one of the first and second reference capacitors to a voltage V is configured to couple the first storage capacitor to the voltage V to store the charge $Q_1$ in the first reference capacitor and wherein the first charge $Q_1$ is $Q_1=VC_{REF}$; and
   wherein each reference charge generator is further configured to:
   accept a first portion of a first control signal at the control electrode of the first switch, the first portion of the first control signal causing the first switch to decouple the first node from the bitline;
   accept a first portion of a second control signal at the control electrode of the second switch, the first portion of the second control signal being configured to cause the second switch to couple the first node to the second node and to cause the first charge $Q_1$ to be split between the first and second reference capacitor, leaving a charge $Q_{REF}$ in the first reference capacitor, where $Q_{REF}=VC_{REF}/2$; and then to decouple the first and second nodes from each other;

accept a first portion of a third control signal at the control electrode of the third switch, the first portion of the third control signal being configured to cause the third switch to couple the second node to ground after the second switch decouples the first and second nodes from each other; and accept a second portion of the first control signal, the second portion of the first control signal being configured to couple the first node to the bitline and to couple at least a portion of the charge $Q_{REF}$ from the first reference capacitor to the bitline.

45. The DRAM of claim 44, wherein the first, second and third switches comprise NMOS transistors.

46. The DRAM of claim 44, wherein the first, second and third switches comprise PMOS transistors.

47. The DRAM of claim 44, wherein the common node comprises a cell plate.

48. The DRAM of claim 36, wherein each reference charge generator configured to couple at least one of the first and second reference capacitors to a voltage V comprises a reference charge generator configured to couple a series combination of the first and second reference capacitors to the voltage V, wherein each reference charge generator configured to store a first charge $Q_1$ in at least one of the first and second reference capacitors comprises a reference charge generator configured to store a first charge $Q_1=C_{REF}V/2$ in the series combination, and wherein each reference charge generator configured to couple a reference charge $Q_{REF}$ from at least one of the first and second reference capacitors comprises a reference charge generator configured to couple the series combination to the bitline and to couple at least a portion of the charge $Q_{REF}$ from the series combination to the bitline.

49. The DRAM of claim 36, wherein the common node comprises a floating node.

50. A reference charge generator comprising:
a first switch having control terninal and first and second load electrodes, the first load electrode being coupled to a bitline, the second load electrode being coupled to a first node;

a first reference capacitor having a capacitance $C_{REF}$ and having first and second terminals, the first terminal being coupled to the first node, the second terminal being coupled to a common node;

A second reference capacitor having a capacitance $C_{REF}$ and having first and second terminals, the second terminal being coupled to the common node, the first and second reference capacitors comprising non-planar container capacitors;

wherein the reference charge generator is configured to couple a reference charge $Q_{REF}$ from at least one of the first and second reference capacitors to the bitline, where $Q_{REF}=C_{REF}V/2$.

51. The reference charge generator of claim 50, wherein the common node comprises a cell plate.

52. THe reference charge generator of claim 50, wherein the voltage V is chosen to be in a rage between zero volts and a power supply voltage $V_{cc}$, inclusive.

53. The reference charge generator of claim 50, wherein the first and second reference capacitors comprise non-plannar container capacitors and are formed along an edge of a DRAM memory array.

54. The reference charge generator of claim 50, wherein the first and second reference capacitors comprise container capacitors and are formed along an edge of a DRAM memory array, the DRAM memory array including storage capacitors each having capacitance less than or equal to $C_{REF}$.

55. The reference charge generator of claim 50, wherein the first switch comprises an NMOS transistor.

56. The reference charge generator of claim 50, wherein the reference charge generator configured to couple a reference charge $Q_{REF}$ comprises a reference charge generator configured to:

couple at least one of the first and second reference capacitors to a voltage V;

decouple the at least one of the first and second capacitors from the voltage V; and store a first charge $Q_1$ in at least one of the first and second reference capacitors; and further comprising:

a second switch having a control electrode and first and second load electrodes, the first load electrode of the second switch being coupled to the first node, the second electrode of the second switch being coupled to a second node and to the first terminal of the second reference capacitor; and a third switch having a control electrode and first and second load electrodes, the first load electrode of the third switch being coupled to the second node and the second load electrode being coupled to a power supply conductor, wherein the reference charge generator configured to couple at least one of the first and second reference capacitors to a voltage V is configured to couple the first storage capacitor to the voltage V to store the charge $Q_1$ in the first reference capacitor and wherein the first charge $Q_1$ is $Q_1=VC_{REF}$; and wherein the reference charge generator is further configured to:

accept a first portion of a first control signal at the control electrode of the first switch, the first portion of the first control signal causing the first switch to decouple the first node from the bitline;

accept a first portion of a second control signal at the control electrode of the second switch, the first portion of the second control signal being configured to cause the second switch to couple the first node to the second node and to cause the first charge $Q_1$ to be split between the first and second reference capacitors, leaving a charge $Q_{REF}$ in the first reference capacitor, where $Q_{REF}=VC_{REF}/2$; and then to decouple the first and second nodes from each other;

accept a first portion of a third control signal at the control electrode of the third switch, the first portion of the third control signal being configured to cause the third switch to couple the second node to ground after the second switch decouples the first and second nodes from each other; and accept a second portion of the first control signal, the second portion of the first control signal being configured to couple the first node to the bitline and to couple at least a portion of the charge $Q_{REF}$ from the first reference capacitor to the bitline.

57. The reference charge generator of claim 56, wherein the first, second and third switches comprise NMOS transistors.

58. The reference charge generator of claim 56, wherein the first, second and third switches comprise PMOS transistors.

59. The reference charge generator of claim 50, wherein the reference charge generator configured to couple a reference charge $Q_{REF}$ comprises a reference charge generator configured to:

couple at least one of the first and second reference capacitors to a voltage V;

decouple the at least one of the first and second capacitors from the voltage V; and store a first charge $Q_1$ in at least one of the first and second reference capacitors; and further wherein the reference charge generator configured to couple at least one of the first and second reference capacitors to a voltage V comprises a reference charge generator configured to couple a series combination of the first and second reference capacitors to the voltage V, wherein the reference charge generator configured to store a first charge $Q_1$ in at least one of the first and second reference capacitors comprises a reference charge generator configured to store a first charge $Q_1 = C_{REF}V/2$ in the series combination, and where the reference charge generator configured to couple a reference charge $Q_{REF}$ from at least one of the first and second reference capacitors comprises a reference charge generator configured to couple the series combination to the bitline and to couple at least a portion of the charge $Q_{REF}$ from the series combination to the bitline.

60. The reference charge generator of claim 51, wherein the common node comprises a floating node.

61. A reference charge generator comprising a first switch, a second switch, a third switch, a first reference capacitor having a capacitance $C_{REF}$, a second reference capacitor having a capacitance $C_{REF}$, wherein the reference charge generator is configured to couple at least one of the first and second reference capacitors to a voltage V, decouple the at least one of the first and second capacitors from the voltage V, store a first charge $Q_1$ in at least one of the first and second reference capacitors and couple a reference charge $Q_{REF}$ from at least one of the first and second reference capacitors to the bit line, where $Q_{REF} = C_{REF}V/2$.

62. The reference charge generator of claim 61, wherein the first, second and third switches comprise PMOS transistors.

63. The reference charge generator of claim 61, wherein the first, second and third switches comprise NMOS transistors.

64. The reference charge generator of claim 61, wherein:
the first switch includes a control terminal and first and second load electrodes, the first load electrode being coupled to a bitline, the second load electrode being coupled to a first node;
the second switch includes a control electrode and first and second load electrodes, the first load electrode of the second switch being coupled to the first node, the second electrode of the second switch being coupled to a second node and to the first terminal of the second reference capacitor; and
the third switch includes a control electrode and first and second load electrodes, the first and second electrode of the third switch being coupled to the second node and the second load electrode being coupled to a power supply conductor.

* * * * *

UNITED STATES PATENT AND TRADEMARK OFFICE
CERTIFICATE OF CORRECTION

PATENT NO. : 6,411,555 B1
DATED : June 25, 2002
INVENTOR(S) : Luan C. Tran

It is certified that error appears in the above-identified patent and that said Letters Patent is hereby corrected as shown below:

Column 1,
Line 35, replace "with layer of silicon nitride that prevents" with -- with a layer of silicon nitride that prevents --

Column 2,
Line 31, replace "(ii) the at least one of the first and second" with -- (ii) decouple the at least one of the first and second --

Column 3,
Line 2, replace "and coupling the first stored charge $Q_{REF}$=" with -- and coupling the first stored charge $Q_{REF}$ --

Column 14,
Line 64, replace "first and second reference capacitor," with -- first and second reference capacitors, --

Column 15,
Line 55, replace "THe reference charge generator of" with -- The reference charge generator of --
Line 56, replace "voltage V is chosen to be in a rage" with -- voltage V is chosen to be in a range --

Signed and Sealed this

Eighteenth Day of March, 2003

JAMES E. ROGAN
*Director of the United States Patent and Trademark Office*